US006819270B1

(12) United States Patent
Cales et al.

(10) Patent No.: US 6,819,270 B1
(45) Date of Patent: Nov. 16, 2004

(54) METHOD AND SYSTEM FOR UNIVERSAL CONVERSION OF MCC, SIC OR OTHER CODES

(75) Inventors: Lori J. Cales, Peoria, AZ (US); James R. Anderson, Glendale, AZ (US); Orville Anthony Williams, Glendale, AZ (US); William G. Coomer, Phoenix, AZ (US); Gopakumar K. Raveendrakumar, Phoenix, AZ (US); Aniruddha V. Khandekar, Scottsdale, AZ (US)

(73) Assignee: American Express Travel Related Services Company, Inc., New York, NY (US)

( * ) Notice: Subject to any disclaimer, the term of this patent is extended or adjusted under 35 U.S.C. 154(b) by 0 days.

(21) Appl. No.: 10/610,100

(22) Filed: Jun. 30, 2003

(51) Int. Cl.[7] .................................................. H03M 7/00
(52) U.S. Cl. ............................................ 341/50; 341/51
(58) Field of Search .............................. 341/50, 51, 83, 341/22; 714/48; 704/226; 379/91.01

(56) References Cited

U.S. PATENT DOCUMENTS

| | | | | |
|---|---|---|---|---|
| 3,229,078 A | * | 1/1966 | Boland et al. | 341/83 |
| 4,839,897 A | * | 6/1989 | Aoki | 714/48 |
| 5,353,408 A | * | 10/1994 | Kato et al. | 704/226 |
| 5,793,302 A | * | 8/1998 | Stambler | 340/5.86 |
| 5,999,596 A | * | 12/1999 | Walker et al. | 379/91.01 |
| 6,215,418 B1 | * | 4/2001 | Struthers | 341/22 |

FOREIGN PATENT DOCUMENTS

JP 2001216169 A * 8/2001

* cited by examiner

*Primary Examiner*—Jean Bruner Jeanglaude
(74) *Attorney, Agent, or Firm*—McDermott Will & Emery LLP

(57) ABSTRACT

A system for converting first code information to second code information including memory means for storing a first conversion table and a second conversion table, means for receiving SIC, MCC and NAICS cod information about a merchant, means for using the first conversion table to convert the SIC, MCC or NAICS code information into a an intermediate code and means for using the second conversion table to convert the intermediate code into SIC, MCC or NAICS code information. The system may also include means for combining the SIC, MCC or NAICS code information with other information and providing a report based on the other information, means for linking incoming transaction data to a customer account and means for generating a report including the SIC, MCC or NAICS code information.

15 Claims, 1 Drawing Sheet

METHOD AND SYSTEM FOR UNIVERSAL CONVERSION OF MCC, SIC OR OTHER CODES

TECHNICAL FIELD

The present subject matter relates to a method and system for converting MCC codes, SIC codes or other similar codes into one universal code from which reports based on one code can be generated. More specifically, a method and system are provided for taking, for example, an MCC code provided by a first party and converting the codes to SIC codes which can be used by the first party or another party.

BACKGROUND

ISO Standard Industrial Classification ("SIC") codes are four digit numerical codes assigned by the U.S. government to business establishments to identify the primary business of the establishment. The classification was developed to facilitate the collection, presentation and analysis of data, and to promote uniformity and comparability in the presentation of statistical data collected by various agencies of the federal government, state agencies and private organizations. The classifications covers all economic activities, including, agriculture; forestry; fishing; hunting and trapping; mining; construction; manufacturing; transportation; communications; electric, gas and sanitary services; wholesale trade; retail trade; finance; insurance and real estate; personal, business, professional, repair, recreation and other services; and public administration.

Generally, the first two digits of the SIC code identify the major industry group, the third digit identifies the industry group and the fourth digit identifies the industry. For example for a SIC code of 3672, the digits "36" refer to electronic and other electric equipment, the digits "367" refer to electronic components and accessories, and the digits "3672" refer to printed circuit boards.

SIC code information can be gathered by transaction card issuers from merchants that accept payment for goods or services using a transaction card. For example, each time a merchant requests approval for a transaction using a card, the card issuers can record the MCC or SIC code, or other similar code, for the merchant. However, transaction card issuers gather these different types of information but do not all gather the same type of code information about merchants.

For example, some, some transaction card issuers gather Merchant Category Code ("MCC") information about merchants. The MCC code is a four digit code that is assigned to a vendor by a bank that issues transaction cards or by transaction card processors at the time the merchant is set up to accept a particular transaction card, e.g., a credit or charge card. The MCC code represents the major commodity sales for that vendor. Other codes are also used sometimes and may other publicly known codes or proprietary codes developed by a card issuer.

Issuers of transaction cards offer their customers various reports to track spending made with the cards. One such report that may be desirable is a report showing the SIC code for all transactions made on the card. Unfortunately, not all card issuers may gather SIC code information about a merchant and/or transaction. Transactions made with a certain card, may be cleared over a number of different merchant networks, not all of which gather or provide SIC transaction data. For example, VISA provides the MCC data, but not SIC code data. It is desirable to be able to receive MCC data, or other code data, from an external network and combine it into a single type of code data, such as SIC code data, which is gathered from an internal network, and provide a report with a single type of code data for all transactions to a card holder.

Accordingly, there is a need for converting MCC data into SIC code data and visa versa. There is also a need to provide a report based on SIC code data. Such reports could include a "spend by industry" report for a transaction card user summarized by SIC codes.

SUMMARY

The present subject matter relates to a method and system for converting one type of data, e.g., MCC code data, to a second type of code data, e.g., SIC code data and for providing a report including the second type of data.

An objective is to provide a global "spend by industry" report based on the second type of code date, e.g., SIC codes, to holders of transaction cards.

Another objective is to enhance a card holder's ability to summarize global transaction data from internal transaction processing networks that utilize SIC data (or other type of data) and external transaction processing networks that do not utilize the same type of code data, but rather utilize another type of code data.

Another objective is to provide card holder's with the ability to more accurately manage and control their spending.

Additional objects, advantages and novel features of the examples will be set forth in part in the description which follows, and in part will become apparent to those skilled in the art upon examination of the following and the accompanying drawings or may be learned by production or operation of the examples. The objects and advantages of the concepts may be realized and attained by means of the methodologies, instrumentalities and combinations particularly pointed out in the appended claims.

BRIEF DESCRIPTION OF THE DRAWING

The drawing figure depict one or more implementations in accord with the present concepts, by way of example only, not by way of limitations. In the figure, like reference numerals refer to the same or similar elements.

DETAILED DESCRIPTION

Figure 1:
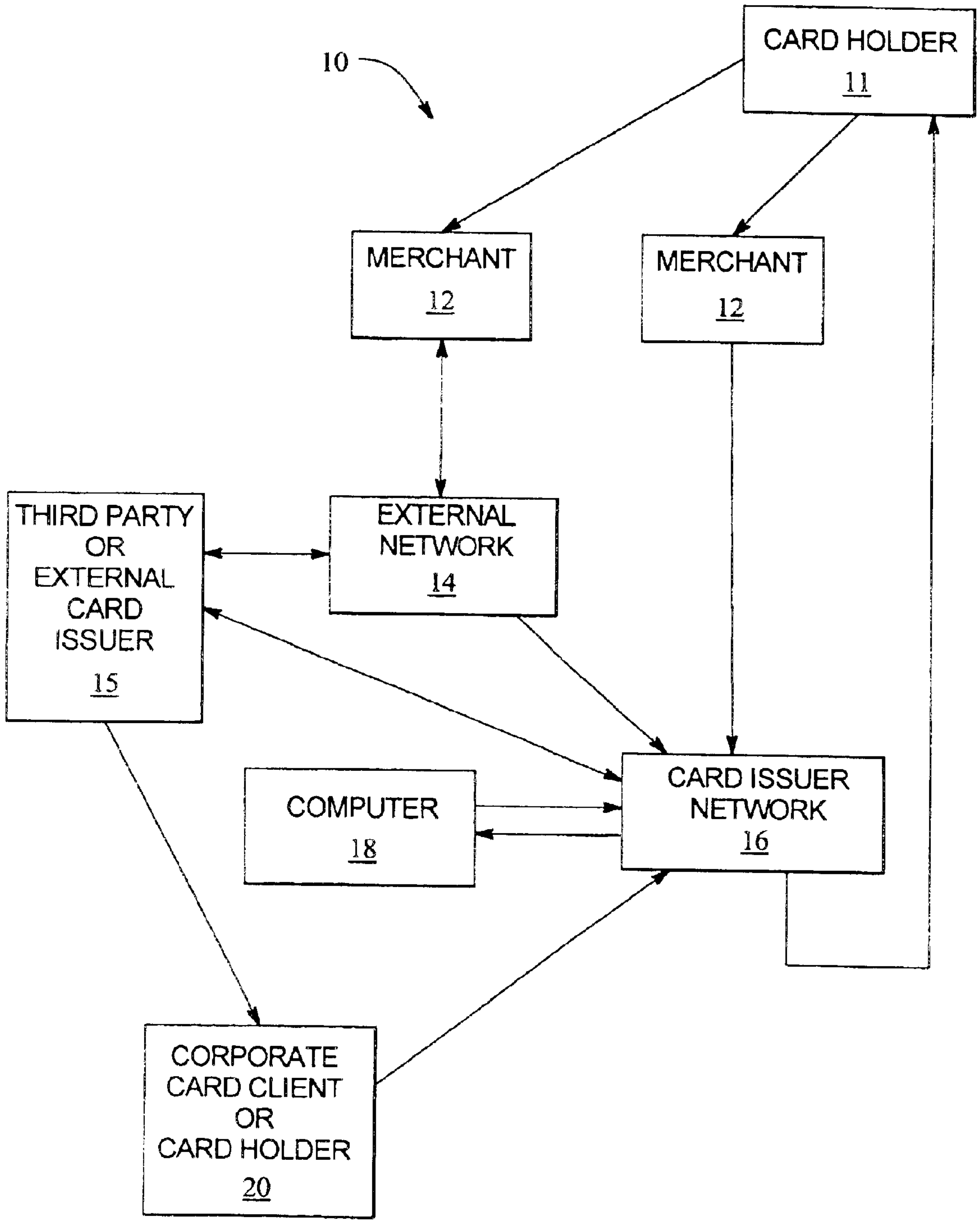
FIG. 1 illustrates a schematic representation of a system for gathering and converting one type of code data to another type of code data.

FIG. 1 is a schematic illustration of a system 10 in which a first type of data and converted into a second type of code data and combined with other second type of code data into a global report for a card holder. As described in the example below, the first type of code data can be MCC code data and the second type of data can be SIC code data. As shown in FIG. 1, a merchant 12, can request approval of a transaction from a card issuer either directly via a card issuer's internal network 16 or indirectly via an external or third party network 14 of a third-party or external card issuer 15.

If the card holder's transaction request is directed to an external network 14, the merchant computer 12 communicates with the external network 14. Then the external network 14 communicates with the internal card issuer network or computer 16. The internal network 16 will receive from the external network 14 MCC data, as well as other data, regarding the transaction and the merchant. The internal network 16 can then store the information in a database in the network 16 or other computer 18 and link or track the information to the customer or card holder's account.

If the merchant's request is directed directly to an internal network 16, the internal network will have or may receive SIC code information or other intermediate or proprietary code information, as well as other information, about the transaction and/or merchant. The SIC code information and/or other proprietary code information about the merchant for the transaction will also be stored in a database in the network 16 or computer 18 and linked to the customer's or card holder's account.

At a designated time, such as monthly or annually at the end of a calendar year, a report can be generated by a computer in the internal network 16 or another computer 18 regarding all purchases made under a given card holder's or customer's account from sorted by SIC codes. As part of this process, any transactions which do not have SIC code information must generate such information by converting any MCC information into SIC code information and/or converting any other intermediate or proprietary code information into SIC code information.

The MCC information can be converted to SIC code information by a computer 18 which uses a conversion table or database stored in a memory storage device. MCC information can be converted by using a MCC to SIC conversion table and stored in the database on the internal network 16 or other computer 18 and then using the conversion table to directly map or convert the MCC data to SIC codes. Alternatively, the MCC data can be converted by using a MCC to intermediate or proprietary code conversion table stored in a database, using the table to map or convert MCC data into the intermediate or proprietary code information and then using a known intermediate or proprietary code to SIC conversion table to convert the intermediate or proprietary code information to SIC data.

It is noted that this system 10 and the process described herein, can also be used to convert one type of identification code or code data into another. For example, MCC code data can be converted into North American Industry Classification System (NAICS) codes. As another example, the conversion can be from SIC code data, NAICS code data or any proprietary or intermediate code data into MCC code data.

Referring back to FIG. 1, the converted or mapped SIC codes can be stored by the issuing network 16 or other computer 18 and used, along with the SIC codes received directly, to generate a variety of different reports based on the SIC codes. Examples of such reports include: a spend by region to SIC industry summary report, a spend by SIC commodity to top suppliers report, a top supplier across all SIC industry report or additional reports using other combinations of the SIC code information and other fields. Of course other reports can be created as well. In addition, reports based on other codes to which the data has been converted, e.g., NAICS codes or MCC codes, may also be generated.

The conversion method and tables may also be used to convert a card holder or company's historical data and provide similar reports based on the historical data. For example a corporate card holder 20 (see FIG. 1) may have several years worth of historic spending information stored for transactions that were made on cards issued by various different card issuers or processed on different card systems. Due to the variety of systems used and information gathered, the historical information may include MCC data for some transactions and SIC, NAICS or other intermediate or proprietary code data for other transactions. If the historical information is provided from the corporate card holder 20 to a computer that can access conversion tables, such as a computer in the card issuer network 16 or other computer 18, the computer can then convert all of the historical information into one universal type of code data, e.g., SIC code data, using the methods and tables described above, to provide various historical reports of a company's past spending in one universal code format.

As described herein, many of the functions relating to the system 10 may be implemented on a computer or computers, which of course may be connected for data communication via components of a network. The hardware of such computer platforms typically is general purpose in nature, albeit with an appropriate network connection for communication via the intranet, the Internet and/or other data networks.

As known in the data processing and communications arts, each such general-purpose computer typically comprises a central processor, an internal communication bus, various types of memory (RAM, ROM, EEPROM, cache memory, etc.), disk drives or other code and data storage systems, and one or more network interface cards or ports for communication purposes. The computer system also may be coupled to a display and one or more user input devices (not shown) such as alphanumeric and other keys of a keyboard, a mouse, a trackball, etc. The display and user input element(s) together form a service-related user interface, for interactive control of the operation of the computer system. These user interface elements may be locally coupled to the computer system, for example in a workstation configuration, or the user interface elements may be remote from the computer and communicate therewith via a network. The elements of such a general-purpose computer system also may be combined with or built into routing elements or nodes of the network.

The software functionalities (e.g., many of the steps shown in the flow charts of FIG. 1) involve programming of software, including executable code as well as associated stored data. The software code is executable by the general-purpose computer that functions as the particular computer. In operation, the executable program code and possibly the associated data are stored within the general-purpose computer platform. At other times, however, the software may be stored at other locations and/or transported for loading into the appropriate general-purpose computer system. Hence, the embodiments involve one or more software products in the form of one or more modules of code carried by at least one machine-readable medium. Execution of such code by a processor of the computer platform enables the system to implement the conversion process and generate reports, in essentially the manner performed in the embodiments discussed and illustrated herein.

As used herein, terms such as computer or machine readable medium refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s). Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

While the foregoing has described what are considered to be the best mode and/or other examples, it is understood that various modifications may be made therein and that the technology disclosed herein may be implemented in various forms and examples, and that they may be applied in numerous applications, only some of which have been described herein. It is intended by the following claims to claim any and all modifications and variations that fall within the true scope of the advantageous concepts disclosed herein.

What is claimed is:

1. A system for converting MCC code information to SIC information comprising:

memory means for storing a first conversion table;

memory means for storing a second conversion table;

means for receiving MCC information about a merchant;

means for using said first conversion table to convert the MCC information into a an intermediate code;

means for using said second conversion table to convert the intermediate code into SIC information.

2. The system of claim 1 further comprising means for combining the SIC information with other information and providing a report based on the other information.

3. The system of claim 1 further comprising means for linking incoming transaction data to a customer account.

4. The system of claim 1 further comprising means for generating a report including said SIC code information.

5. The system of claim 4 wherein said report is organized based on said SIC code information.

6. A system for converting SIC code information to MCC information comprising:

memory means for storing a first conversion table;

memory means for storing a second conversion table;

means for receiving SIC information about a merchant;

means for using said first conversion table to convert the SIC information into a an intermediate code;

means for using said second conversion table to convert the intermediate code into MCC information.

7. The system of claim 6 further comprising means for combining the MCC information with other information and providing a report based on the other information.

8. The system of claim 6 further comprising means for linking incoming transaction data to a customer account.

9. The system of claim 6 further comprising means for generating a report including said MCC code information.

10. The system of claim 9 wherein said report is organized based on said MCC code information.

11. A system for converting first code information to second code information comprising:

memory means for storing a first conversion table;

memory means for storing a second conversion table;

means for receiving first code information about a merchant, said first code information being selected from the group consisting of SIC, MCC and NAICS;

means for using said first conversion table to convert said first code information into a an intermediate code;

means for using said second conversion table to convert the intermediate code into second code information, said second code information being selected from the group consisting of SIC, MCC and NAICS and said second code information being different from said first code information.

12. The system of claim 11 further comprising means for combining the second code information with other information and providing a report based on the other information.

13. The system of claim 11 further comprising means for linking incoming transaction data to a customer account.

14. The system of claim 11 further comprising means for generating a report including said second code information.

15. The system of claim 14 wherein said report is organized based on said second code information.

* * * * *